United States Patent [19]

Yasuda et al.

[11] Patent Number: 4,566,174

[45] Date of Patent: Jan. 28, 1986

[54] SEMICONDUCTOR DEVICE AND METHOD FOR MANUFACTURING THE SAME

[75] Inventors: Seiji Yasuda, Yokohama; Yutaka Koshino; Toshio Yonezawa, both of Yokosuka, all of Japan

[73] Assignee: Tokyo Shibaura Denki Kabushiki Kaisha, Kawasaki, Japan

[21] Appl. No.: 545,545

[22] Filed: Oct. 26, 1983

[30] Foreign Application Priority Data

Oct. 27, 1982 [JP]  Japan .................................. 57-188608

[51] Int. Cl.[4] ............................................. H01L 21/76
[52] U.S. Cl. .................................. 29/576 W; 29/580; 148/175; 148/DIG. 50
[58] Field of Search ............... 29/576 W, 580; 357/48; 148/175, DIG. 50, 33.2

[56] References Cited

U.S. PATENT DOCUMENTS

| | | | |
|---|---|---|---|
| 3,397,448 | 8/1968 | Tucke | 148/175 |
| 3,456,169 | 7/1969 | Klein | 148/175 |
| 4,056,413 | 11/1977 | Yoshimura | 148/175 |
| 4,346,513 | 8/1982 | Nishizawa et al. | 29/580 |

OTHER PUBLICATIONS

Leuenberger et al., Complementary-MOS Low Power Low Voltage Integrated Binary Counter, IEEE, vol. 57, No. 9, Sep. 1969.

Sakurai, "A New Complementary Dielectric Isolation Process for High Voltage Devices," IEEE Trans. Electron Device, vol. ED-28, No. 10, Oct. 1981.

Beasom, "A Process for Simultaneous Fabrication of Verticle NPN and PNP's, Nch, and Pch MOS Devices," IEDM Technical Digest, Dec. 1976.

Imaizumi et al., "Novel IC Structure for 150V High-Voltage Consumer IC," IEEE Trans. Consumer Electronics, vol. CE-26, pp. 367-375, Aug. 1980.

Primary Examiner—Brian E. Hearn
Assistant Examiner—Hunter L. Auyang
Attorney, Agent, or Firm—Finnegan, Henderson, Farabow, Garrett & Dunner

[57] ABSTRACT

A method of manufacturing a semiconductor device wherein a pair of grooves having different depths are formed in a surface of a semiconductor substrate, an epitaxial layer of one conductivity type is grown to a depth enough to fill a shallower one of the grooves, and an epitaxial layer of the opposite conductivity type is further grown to a depth enough to fill a deeper one of the grooves, followed by the step of etching the entire surface to expose the surface of said semiconductor substrate and to leave in each groove an epitaxial layer of mutually different conductivity type and having the same depth and width. A semiconductor device as manufactured by the above method.

6 Claims, 5 Drawing Figures

F I G. 2(C)
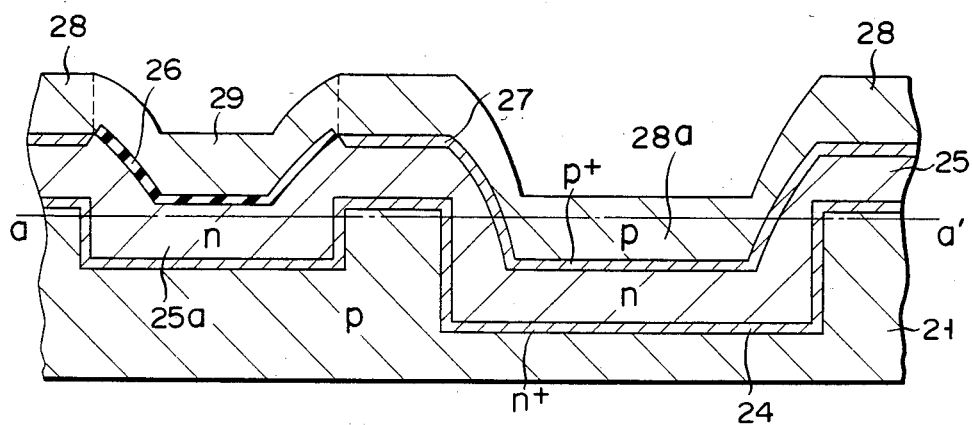
F I G. 2(D)
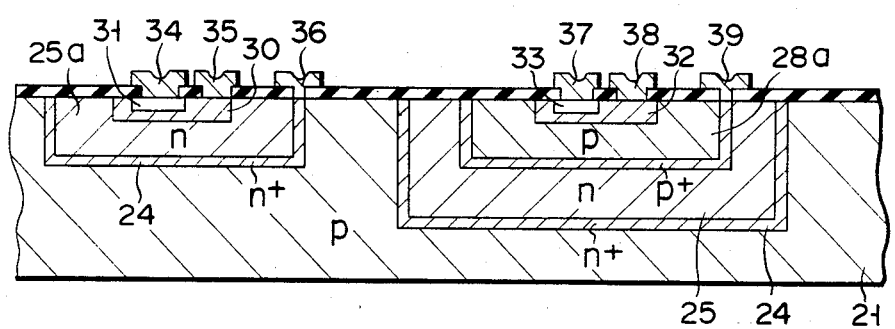

SEMICONDUCTOR DEVICE AND METHOD FOR MANUFACTURING THE SAME

BACKGROUND OF THE INVENTION (a) Field of the Invention

The present invention relates to a semiconductor device such as a bipolar linear IC (integrated circuit) of a complementary configuration used for an output stage of audio equipment which requires a high dielectric withstand voltage or high output.

(b) Description of the Prior Art

Conventionally, npn and pnp transistors are combined in a bipolar IC. Vertical npn transistors and lateral pnp transistors are used according to manufacturing restrictions.

More particularly, vertical npn transistors and lateral pnp transistors are used to simplify the process for manufacturing a semiconductor device. According to this manufacturing process, the base region of the npn transistor and the emitter and collector regions of the pnp transistor can be simultaneously formed. However, only a low power can be applied to the lateral pnp transistor, as compared with that applied to the vertical npn transistor. In order to obtain a high power vertical transistor unit, a plurality of vertical transistors must be connected in parallel with each other. In addition to this disadvantage, a transition frequency $f_T$ of the npn transistor is about several hundreds of megahertz, while a transition frequency $f_T$ of the lateral pnp transistor is about several megahertz.

In view of this problem, it has been proposed to form vertical pnp transistors in an n-type epitaxial layer on a p-type substrate.

FIG. 1 is a sectional view of a bipolar linear IC having a vertical npn transistor and a vertical pnp transistor. Referring to FIG. 1, reference numeral 11 denotes a p-type substrate; 12, an n+-type diffusion layer; 13, an n-type epitaxial layer; 14, a base diffusion layer; 15, an emitter diffusion layer; 16, a p+-type buried layer; 17, a p-type emitter layer; and 18, an n+-type layer.

In the vertical pnp transistor shown in FIG. 1, the n+-type buried layer 12 contacts the p+-type buried layer 16, so the dielectric withstand voltage is limited. As a result, the same dielectric withstand voltage as in the npn transistor cannot be obtained. The base region of the vertical pnp transistor has an impurity concentration lower than that of the collector region. The Early effect thus tends to occur. Furthermore, the base width of the vertical pnp transistor is greater than that of the vertical npn transistor. As a result, it is very difficult to obtain the same electrical characteristics as in the vertical npn transistor.

SUMMARY OF THE INVENTION

The present invention has been made in consideration of the above situation, and has for its object to provide a semiconductor device having a pair of semiconductor elements such as bipolar transistors, MOS-FETs, or junction FETs of opposing conductivity types and of completely equivalent characteristics, and a method for manufacturing the same.

According to an aspect of the present invention, there is provided a method for manufacturing a semiconductor device, comprising the steps of: forming at least a pair of grooves having different depths in a surface of a semiconductor substrate of a first conductivity type; diffusing an impurity of a second conductivity type which has a high concentration in a surface including said at least a pair of grooves; forming an epitaxial layer of the second conductivity type on said surface including said at least a pair of grooves such that said epitaxial layer has a thickness greater than a depth of a shallow groove of said at least a pair of grooves and such that an upper surface of said epitaxial layer in a deep groove of said at least a pair of grooves is substantially lower than said surface of said semiconductor substrate; diffusing an impurity of the first conductivity type in said upper surface of said epitaxial layer of the second conductivity type after a mask layer is formed on a portion of said epitaxial layer which corresponds to said shallow groove; forming an epitaxial layer of the first conductivity type on said surface including said at least a pair of grooves; etching an entire surface to be level and to expose said surface of said semiconductor substrate, and forming epitaxial layers of the first and second conductivity types in said at least a pair of grooves, respectively, said epitaxial layers having the same depth and width; and forming desired semiconductor elements in said epitaxial layers, respectively.

According to another aspect of the present invention, there is provided a semiconductor device comprising: a semiconductor substrate of a first conductivity type; epitaxial layers of a second conductivity type which are formed in at least a pair of grooves which are formed in a surface of said semiconductor substrate of the first conductivity type and which have different depths, through impurity layers of the second conductivity type which have a high concentration; an epitaxial layer of the first conductivity type formed in a deeper groove of said at least a pair of grooves through a high impurity concentration layer of the first conductivity type, said epitaxial layer of the first conductivity type having substantially the same depth and width as that of said epitaxial layer of the second conductivity type which is formed in a shallower groove of said at least a pair of grooves; and semiconductor elements of different conductivity types which are formed in said epitaxial layers of the first and second conductivity types.

BRIEF DESCRIPTION OF THE DRAWINGS

FIGS. 2(A) to 2(D) are sectional views for explaining the steps of manufacturing a bipolar linear IC having a complementary configuration according to an embodiment of the present invention.

DETAILED DESCRIPTION OF THE PREFERRED EMBODIMENT

The present invention will be described with reference to a case wherein it is applied to a method for manufacturing a bipolar linear IC having a complementary configuration.

Figure 1:
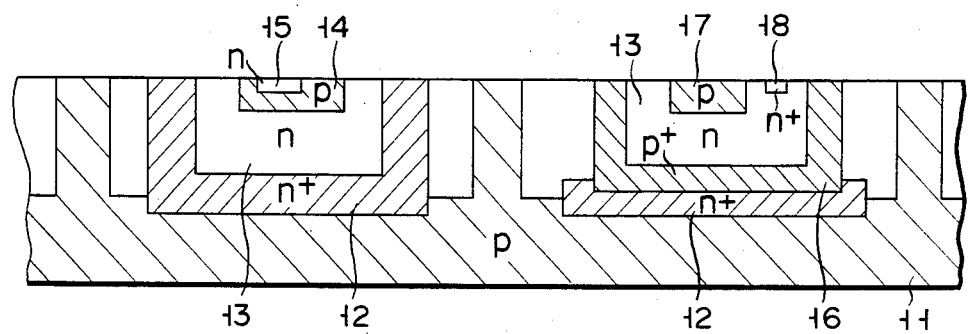
FIG. 1 is a sectional view of a bipolar linear IC having a conventional complementary configuration.
Figure 2A:
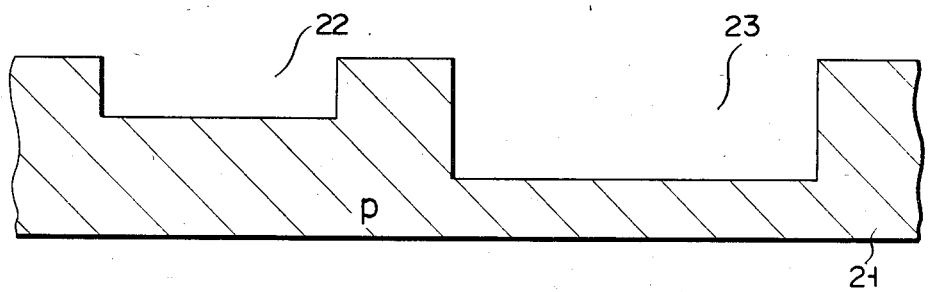
Figure 2B:
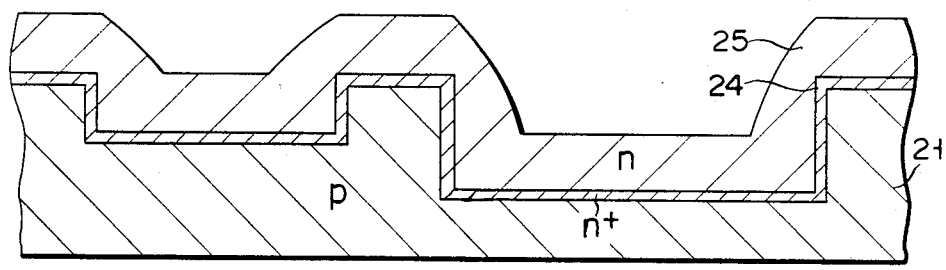

Referring to FIG. 2(A), vertical grooves 22 and 23 are formed by reactive ion etching in a prospective npn transistor formation region and a prospective pnp transistor formation region, respectively, of a surface of a p-type semiconductor substrate 21. In this case, the grooves can be formed by wet etching to have inclined walls, respectively. When an npn transistor having a dielectric withstand voltage of 150 V is to be formed, and an impurity concentration of an n-type epitaxial layer is set to be $5 \times 10^{14}$ cm$^{-3}$, the groove 22 has a depth of 20 μm. On the other hand, the groove 23 as the prospective pnp transistor formation region has a depth of about 40 μm, which is twice the depth of the groove 22. The width of the groove 23 is slightly greater than that of the groove 22. An n+-type layer 24 is formed by thermal diffusion to cover the entire surface of the semiconductor substrate 21 which includes the grooves 22 and 23. Thereafter, an n-type epitaxial layer 25 is formed to cover the entire surface to a thickness of 20 μm (FIG. 2(B)).

A surface layer of the n-type epitaxial layer 25 is oxidized to form an oxide film. Subsequently, the oxide film is etched to leave only an oxide film 26 formed on the groove 22. A p+-type diffusion layer 27 is formed by using the oxide film 26 as a mask. A p-type epitaxial layer 28 is formed to cover the entire surface to a thickness of 20 μm. As a result, a polycrystalline silicon layer 29 is formed on the oxide film 26, and a monocrystalline silicon layer is formed on the p+-type diffusion layer 27 (FIG. 2(C)). As shown in FIG. 2(C), the oxide film 26 is then completely removed, and the upper surface of the semiconductor substrate 21 is just exposed. In other words, etching is performed to a depth indicated by an alternate long and short dashed line $a—a'$. As a result, an n-type epitaxial layer 25a and a p-type epitaxial layer 28a are formed in the grooves 22 and 23, respectively. These epitaxial layers 25a and 28a have substantially the same thickness and width.

Ion etching (using ions such as Ne and Ar), plasma etching, mechanical lapping, or chemical lapping is used as an etching method for etching the film down to the alternate long and short dashed line. Among these etching methods, a combination of mechanical lapping and chemical lapping is most preferable.

In order to form an npn transistor in the n-type epitaxial layer 25a, a p-type base region 30 and an n-type emitter region 31 are sequentially formed by a known technique. Meanwhile, in order to form a pnp transistor in the p-type epitaxial layer 28a, an n-type base region 32 and a p-type emitter region 33 are sequentially formed by a known technique. Finally, an electrode wiring pattern is formed to obtain a pair of an npn transistor and a pnp transistor which are complementary in construction and characteristics, as shown in FIG. 2(D). Referring to FIG. 2(D), reference numeral 34 denotes an emitter electrode of the npn transistor; 35, a base electrode thereof; 36, a collector electrode thereof; 37, an emitter electrode of the pnp transistor; 38, a base electrode thereof; and 39, a collector electrode thereof.

As has been apparent from the above description of the present invention, the npn transistor is formed in the n-type epitaxial layer, and the pnp transistor is formed in the p-type epitaxial layer. As a result, these transistors have substantially the same electrical characteristics. In addition to this advantage, the problem of limited dielectric withstand voltage can be eliminated, unlike in the conventional complementary configuration.

The present invention is not limited to the particular embodiment described above. A pair of an n-channel MOS-FET and a p-channel MOS-FET, or a pair of an n-channel junction FET and a p-channel junction FET can be formed in the n-type and p-type epitaxial layers 25a and 28a, respectively.

What is claimed is:
1. A method for manufacturing a bipolar semiconductor device comprising vertical npn and pnp transistors, comprising the steps of:
   (a) forming at least a pair of grooves having different depths in a surface of a semiconductor substrate of a first conductivity type;
   (b) diffusing a high concentration of impurity of a second conductivity type in a surface including said at least a pair of grooves;
   (c) forming an epitaxial layer of the second conductivity type on said surface including said at least a pair of grooves such that said epitaxial layer has a thickness greater than a depth of a shallow groove of said at least a pair of grooves and such that an upper surface of said epitaxial layer in a deep groove of said at least a pair of grooves is substantially lower than said surface of said semiconductor substrate;
   (d) diffusing a high concentration of impurity of the first conductivity type in said upper surface of said epitaxial layer of the second conductivity type after a mask layer is formed on a portion of said epitaxial layer which corresponds to said shallow groove;
   (e) forming an epitaxial layer of the first conductivity type on said surface including said at least a pair of grooves;
   (f) etching an entire surface to be level, to expose said surface of said semiconductor substrate, thereby to leave epitaxial layers of the first and second conductivity types in said at least a pair of grooves, respectively, said epitaxial layers of the first and second conductivity types having the same depth and width;
   (g) forming a base region and an emitter in said epitaxial layers in said at least a pair of grooves, respectively, thereby to form the npn and pnp transistors; and
   (h) forming base and emitter electrodes, each connected respectively to the base and emitter regions, and collector electrodes connected respectively to the impurity diffusion layers formed in the step (c) and the step (d).

2. A method according to claim 1, wherein said deep groove has a depth twice that of said shallow groove in the step (a).

3. A method according to claim 1, wherein said mask layer in the step (d) is formed by oxidizing said upper surface of said epitaxial layer of the second conductivity type formed in the step (c).

4. A method according to claim 1, wherein said at least a pair of grooves formed in the step (a) are formed by an etching technique to have inclined walls, respectively.

5. A method according to claim 1, wherein said at least a pair of grooves formed in the step (a) are formed by an etching technique to have vertical walls, respectively.

6. A method according to claim 1, wherein the step (f) comprises a combination of mechanical lapping and chemical lapping.

* * * * *